(12) United States Patent
Shih et al.

(10) Patent No.: US 11,522,517 B2
(45) Date of Patent: Dec. 6, 2022

(54) SURFACE ACOUSTIC WAVE DEVICE AND METHOD OF MANUFACTURING THE SAME

(71) Applicant: CHIPBOND TECHNOLOGY CORPORATION, Hsinchu (TW)

(72) Inventors: Cheng-Hung Shih, Changhua County (TW); Cheng-Fan Lin, Hsinchu County (TW)

(73) Assignee: CHIPBOND TECHNOLOGY CORPORATION, Hsinchu (TW)

(*) Notice: Subject to any disclaimer, the term of this patent is extended or adjusted under 35 U.S.C. 154(b) by 616 days.

(21) Appl. No.: 16/581,901

(22) Filed: Sep. 25, 2019

(65) Prior Publication Data

US 2021/0013865 A1 Jan. 14, 2021

(30) Foreign Application Priority Data

Jul. 10, 2019 (TW) ................................. 108124391

(51) Int. Cl.
*H03H 9/02* (2006.01)
*H01L 41/047* (2006.01)
*H03H 9/05* (2006.01)
*H03H 9/145* (2006.01)

(52) U.S. Cl.
CPC ..... *H03H 9/02952* (2013.01); *H01L 41/0477* (2013.01); *H03H 9/02834* (2013.01); *H03H 9/059* (2013.01); *H03H 9/145* (2013.01)

(58) Field of Classification Search
CPC .......... H03H 9/02952; H03H 9/02834; H03H 3/059; H03H 3/145; H01L 41/0477
See application file for complete search history.

(56) References Cited

U.S. PATENT DOCUMENTS

| 8,154,170 B2 | 4/2012 | Kimura et al. | |
|---|---|---|---|
| 2008/0018415 A1 | 1/2008 | Miyaji | |
| 2014/0125197 A1* | 5/2014 | Fujita | H03H 9/1092 310/313 B |
| 2017/0187353 A1* | 6/2017 | Hirano | H03H 9/1064 |

(Continued)

FOREIGN PATENT DOCUMENTS

| JP | 10-209164 A | 8/1998 |
|---|---|---|
| JP | H10-284980 A | 10/1998 |

(Continued)

OTHER PUBLICATIONS

European Search Report dated Mar. 17, 2020 for European Patent Application No. 19200015.6, 14 pages.

(Continued)

*Primary Examiner* — Bryan P Gordon
(74) *Attorney, Agent, or Firm* — Demian K. Jackson; Jackson IPG PLLC

(57) ABSTRACT

A surface acoustic wave device includes a piezoelectric substrate, a supportive layer, a cover layer and a pillar bump. The supportive layer is disposed on the piezoelectric substrate and around a transducer, the cover layer covers the supportive layer, and the pillar bump is located in a lower via hole of the supportive layer and an upper via hole of the cover layer. The upper via hole has a lateral opening located on a lateral surface of the cover layer, and the pillar bump in the cover layer protrudes from the lateral surface of the cover layer via the lateral opening.

7 Claims, 13 Drawing Sheets

(56) References Cited

U.S. PATENT DOCUMENTS

2017/0359049 A1* 12/2017 Toyota ................... H03H 9/059
2018/0076786 A1* 3/2018 Funahashi .......... H03H 9/02535
2018/0278238 A1* 9/2018 Kuroyanagi ............. H03H 9/70

FOREIGN PATENT DOCUMENTS

| JP | 2008-130932 A | 6/2008 |
| JP | 2013-239753 A | 11/2013 |
| JP | 2014-007722 A | 1/2014 |
| JP | 2014-57124 A | 3/2014 |
| JP | 2015-12428 A | 1/2015 |
| JP | 2015-39204 A | 2/2015 |
| JP | 6298120 B2 | 3/2018 |
| KR | 10-1336150 B1 | 12/2013 |
| KR | 10-2017-0139090 A | 12/2017 |
| WO | 2012/144370 A1 | 10/2012 |
| WO | 2016/185866 A1 | 11/2016 |

OTHER PUBLICATIONS

Japanese Office Action dated Oct. 12, 2020 for Japanese Patent Application No. 2019-176196, 4 pages.
Korean Office Action dated Dec. 18, 2020 for Korean Patent Application No. 10-2019-0119679, 6 pages.
Taiwanese Office Action dated Nov. 7, 2019 for Taiwanese Patent Application No. 108124391, 4 pages.
Japanese notice of allowance dated Feb. 8, 2021 for Japanese Patent Application No. 2019-176196, 3 pages.

* cited by examiner

SURFACE ACOUSTIC WAVE DEVICE AND METHOD OF MANUFACTURING THE SAME

FIELD OF THE INVENTION

This invention relates to a surface acoustic wave (SAW) device, and more particularly to a SAW device having improved frequency response capability.

BACKGROUND OF THE INVENTION

FIG. 21 shows a conventional SAW device 200 which includes a piezoelectric substrate 210, a wall 220, a lid 230, a bump 240 and a solder cap 250. The piezoelectric substrate 210 includes a carrier 211, a pad 212 and an interdigital transducer (IDT) 213, the pad 212 and the IDT 213 are mounted on the carrier 211. The wall 220 surrounds the IDT 213 and the lid 230 covers the wall 220 so that the IDT 213 is located in a space between the lid 230 and the piezoelectric substrate 210, the bump 240 is located in a via hole through the wall 220 and the lid 230, and the solder cap 250 is electrically connected to the pad 212 via the bump 240.

The package size of the conventional SAW device 200 is bigger than the space for receiving the IDT 213 due to the bump 240 disposed in the via hole inside the wall 220 and the lid 230, and more parasitic capacitance may be generated to reduce the performance of the conventional SAW device 200.

Capabilities of SAW generation/detection and frequency response are positively related to number of IDT finger pairs. The more the IDT finger pairs, the bigger the size of the SAW device is required to provide a bigger space for receiving IDT, but increasing SAW device size to improve performance cannot meet requirements of miniaturization. Besides, the more the IDT finger pairs, the more the heat generated by IDT, the SAW device may be unstable when heat dissipation cannot be achieved sufficiently.

SUMMARY

The object of the present invention is to provide a SAW device having less parasitic capacitance and higher performance by reducing difference between receiving space area of transducer and package area of SAW device.

A SAW device of the present invention includes a piezoelectric substrate, a supportive layer, a cover layer and a pillar bump. The piezoelectric substrate includes a base, a conductive pad and a transducer, the conductive pad and the transducer are disposed on the base and electrically connected with each other. The supportive layer is disposed on the piezoelectric substrate and surrounds the transducer, a lower via hole and an opening hole are formed in the supportive layer, the lower via hole is located outside the opening hole and exposes the conductive pad, and the opening hole is located above the transducer. The cover layer is disposed on the supportive layer and covers the opening hole, an upper via hole is formed in the cover layer, located above the lower via hole and communicated to the lower via hole. The upper via hole has a first top opening, a first bottom opening and a first lateral opening. The first top opening is located on a top surface of the cover layer, the first bottom opening is located on a bottom surface of the cover layer, the first lateral opening is located on a lateral surface of the cover layer, and both ends of the first lateral opening are connected to the first top opening and the first bottom opening, respectively. The pillar bump is disposed in the lower via hole and the upper via hole and connected to the conductive pad. The pillar bump in the cover layer includes a first part and a second part, the first part is located in the upper via hole and the second part is protruded from the lateral surface of the cover layer via the first lateral opening of the upper via hole.

A method of manufacturing a SAW device of the present invention includes a step of providing a piezoelectric substrate including a base, a conductive pad and a transducer, the conductive pad and the transducer are disposed on the base and electrically connected with each other; a step of forming a supportive layer on the piezoelectric substrate; a step of patterning the supportive layer to form a lower via hole and an opening hole, the lower via hole is located outside the opening hole and exposes the conductive pad, the opening hole is located above the transducer, and the patterned supportive layer surrounds the transducer; a step of forming a cover layer on the supportive layer, the cover layer covers the opening hole; a step of patterning the cover layer to form an upper via hole, the upper via hole is located above the lower via hole and communicated to the lower via hole, the upper via hole has a first top opening, a first bottom opening and a first lateral opening, the first top opening is located on a top surface of the cover layer, the first bottom opening is located on a bottom surface of the cover layer, the first lateral opening is located on a lateral surface of the cover layer, and both ends of the first lateral opening are connected to the first top opening and the first bottom opening, respectively; a step of forming a photoresist layer on the cover layer; a step of patterning the photoresist layer to form an opening, the opening is communicated to the upper via hole; a step of forming a pillar bump in the lower via hole and the upper via hole, the pillar bump is connected to the conductive pad; and a step of removing the photoresist layer. The pillar bump in the cover layer includes a first part and a second part, the first part is located in the upper via hole and the second part is protruded from the lateral surface of the cover layer via the first lateral opening of the upper via hole.

Compared to conventional SAW device, the package area of the SAW device of the present invention is more close to the space for accommodating the transducer such that high frequency parasitic capacitance can be reduced to improve the performance of the SAW device of the present invention.

The SAW device of the present invention having a package area identical to that of conventional SAW device has a bigger space able to receive more transducers to increase surface acoustic wave generation/detection capability and frequency response rate such the SAW device of the present invention has an advantage of improving performance. On the other hand, the SAW device of the present invention has an advantage of reducing package size because the SAW device of the present invention has a smaller package size than that of the conventional SAW device when they have the same number of IDT pairs. Additionally, the SAW device of the present invention is more stable than the conventional SAW device because the pillar bump protruded from the lateral surface of the cover layer is able to dissipate heat generated by the transducer.

DETAILED DESCRIPTION OF THE INVENTION

Figure 1:
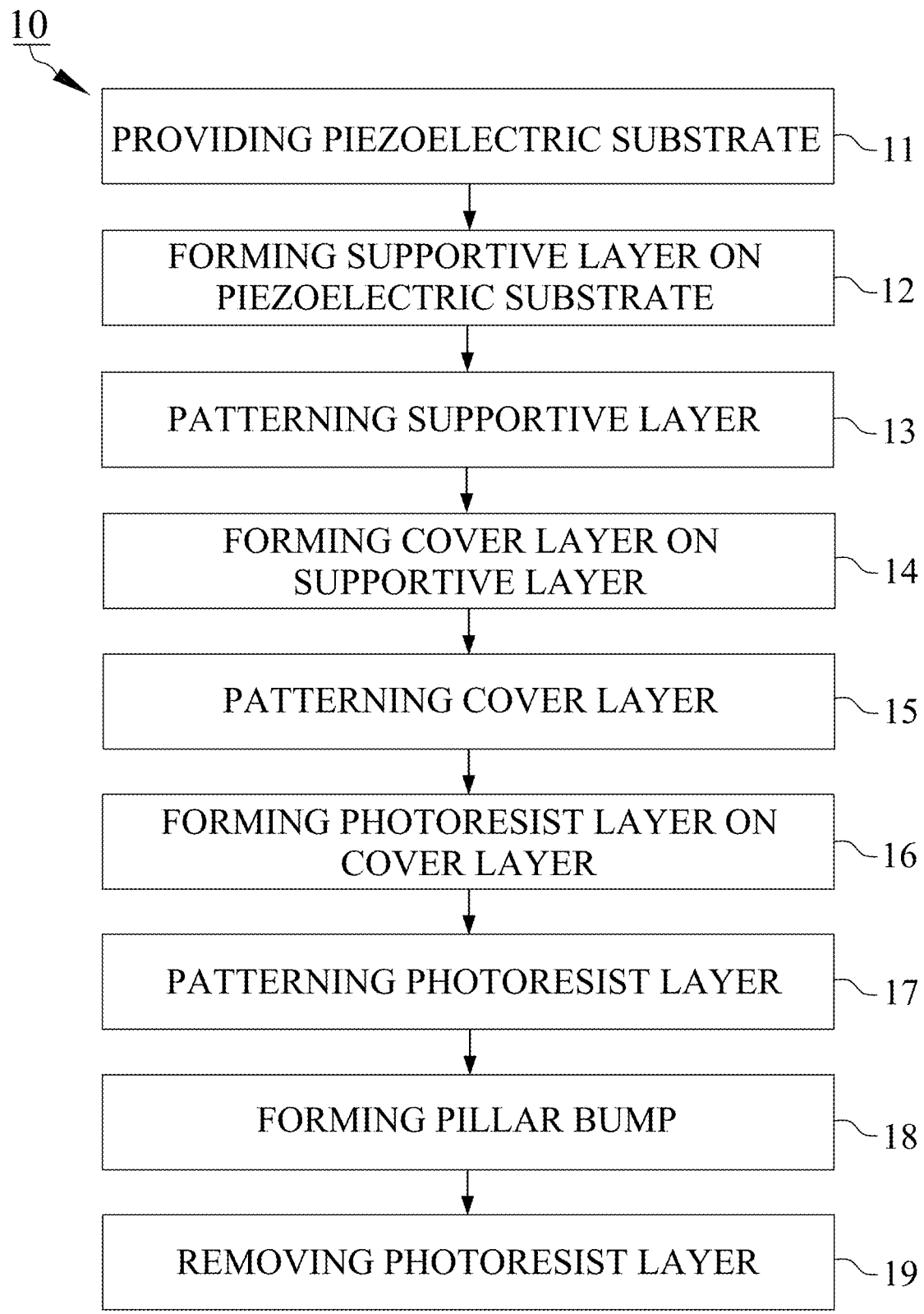
FIG. 1 is a flowchart illustrating a method of manufacturing a SAW device in accordance with one embodiment of the present invention.

With reference to FIG. 1, a method 10 of manufacturing a SAW device in accordance with one embodiment of the present invention includes a step 11 of providing piezoelectric substrate, a step 12 of forming supportive layer on piezoelectric substrate, a step 13 of patterning supportive layer, a step 14 of forming cover layer on supportive layer, s step 15 of patterning cover layer, a step 16 of forming photoresist layer on cover layer, a step 17 of patterning photoresist layer, a step 18 of forming pillar bump and a step 19 of removing photoresist layer.

Figure 2:
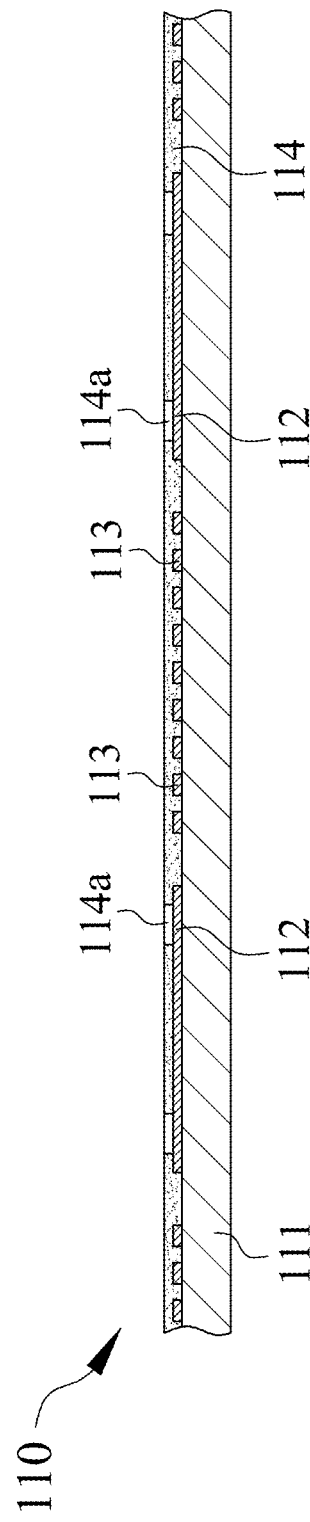
FIG. 2 is a cross-section view diagram illustrating a piezoelectric substrate in accordance with one embodiment of the present invention.

With reference to FIG. 2, a piezoelectric substrate 110 provided in the step 11 includes a base 111, a conductive pad 112 and a transducer 113. The base 111 is made of piezoelectric material such as quartz, $LiTaO_3$ (LT), $LiNbO_3$ (LN), $PbTiO_3$ (PTO) or $Pb(Zr, Ti)O_3$ (PZT). The conductive pad 112 and the transducer 113 are disposed on a surface of the base 111 and electrically connected with each other. The conductive pad 112 and the transducer 113 may be made of same metal or different metals, such as aluminum (Al), molybdenum (Mo), copper (Cu), nickel (Ni), silver (Ag), gold (Au), tungsten (W), tantalum (Ta) and platinum (Pt). The piezoelectric substrate 110 preferably further includes a protective layer 114 which covers the transducer 113 and has an opening 114a exposing the conductive pad 112. In some embodiments, the piezoelectric substrate 110 includes an interdigital transducer (IDT) having a plurality of transducers 113.

Figure 3:
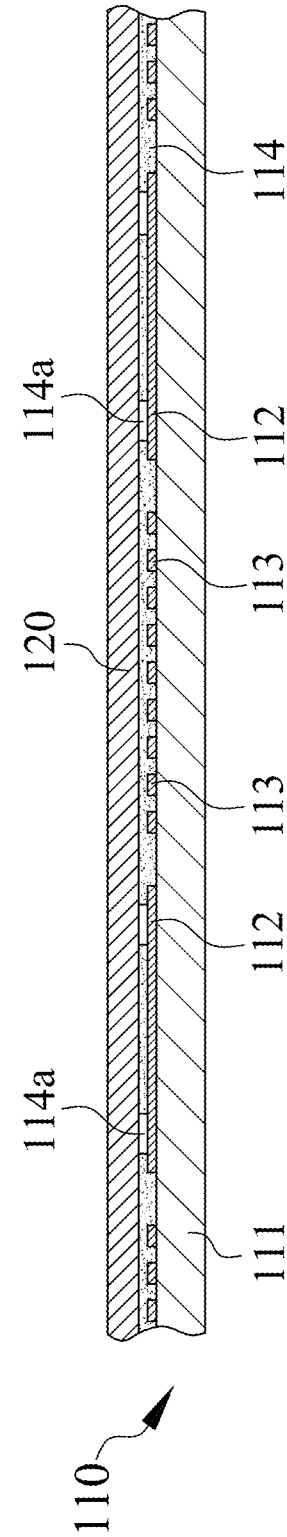
FIGS. 3 and 4 are cross-section view diagrams illustrating a method of manufacturing a SAW device in accordance with one embodiment of the present invention.
Figure 4:
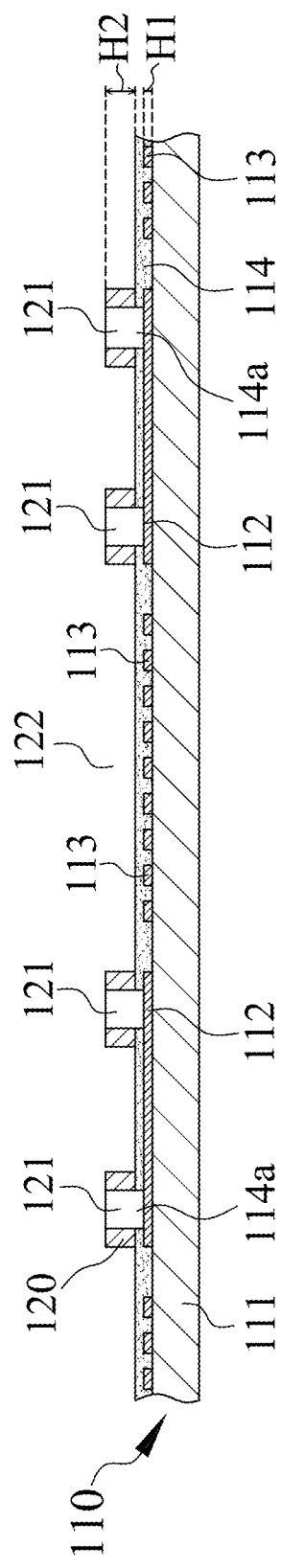
Figure 5:
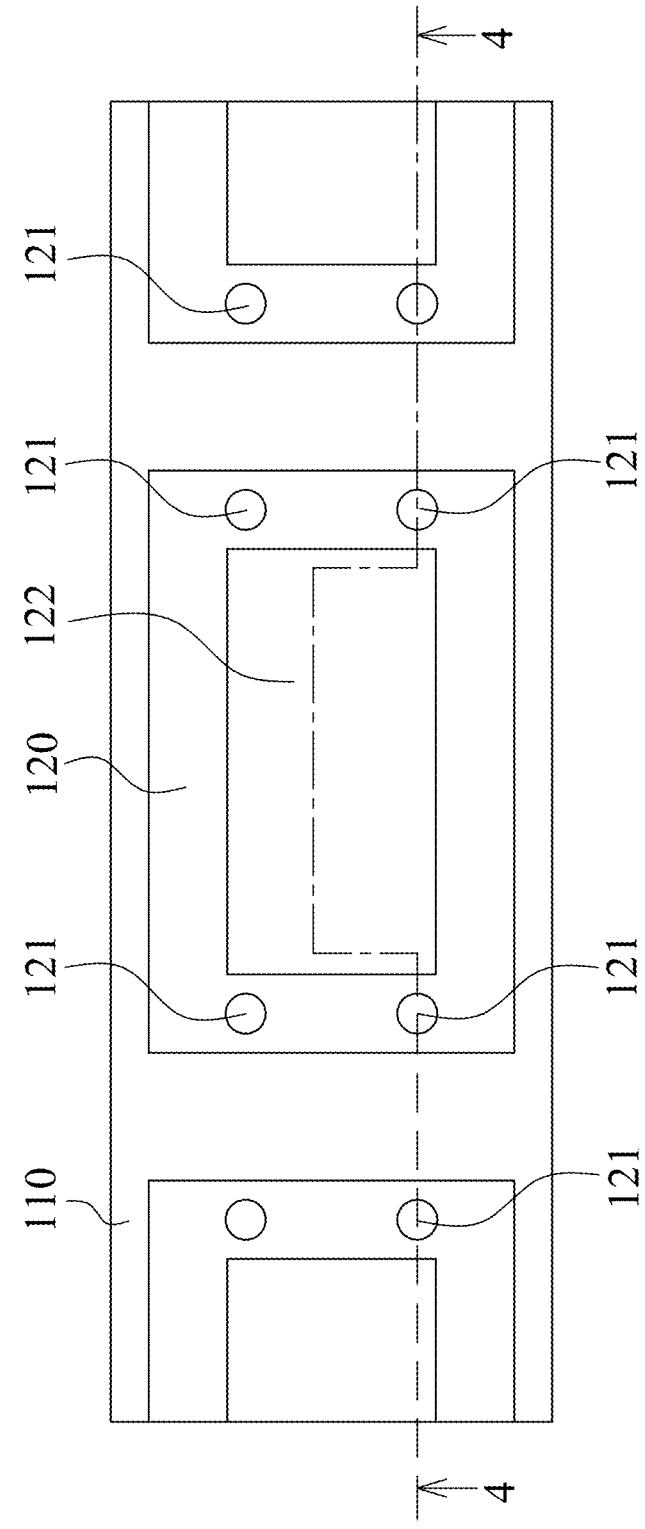
FIG. 5 is a top view diagram of FIG. 4.

With reference to FIGS. 3, 4 and 5, a supportive layer 120, maybe made of a polymer material (e.g. epoxy resin or polyimide), is formed on the piezoelectric substrate 110 in the step 12. Next, the supportive layer 120 is patterned by lithography in the step 13 to form a lower via hole 121 and an opening hole 122 located outside the lower via hole 121. The lower via hole 121 exposes the conductive pad 112, and the opening hole 122 is located above the transducer 113. Preferably, a plurality of lower via holes 121 (may be 4, 6 or more) are formed in the supportive layer 120, and the supportive layer 120 has a height H2 higher than a height H1 of the transducer 113. In this embodiment, the opening hole 122 exposes the protective layer 114 covering the transducer 113, and the patterned supportive layer 120 becomes a wall surrounding the transducer 113.

Figure 6:
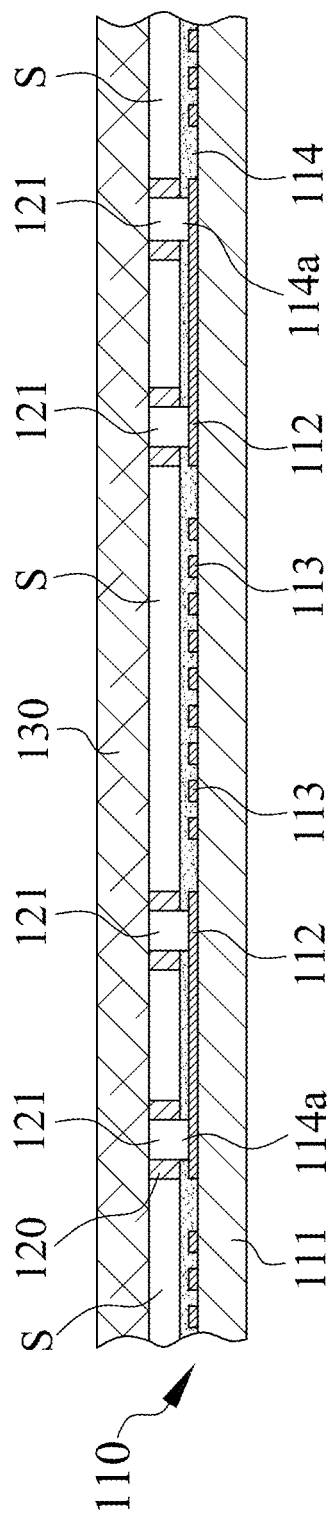
FIGS. 6 and 7 are cross-section view diagrams illustrating a method of manufacturing a SAW device in accordance with one embodiment of the present invention.
Figure 7:
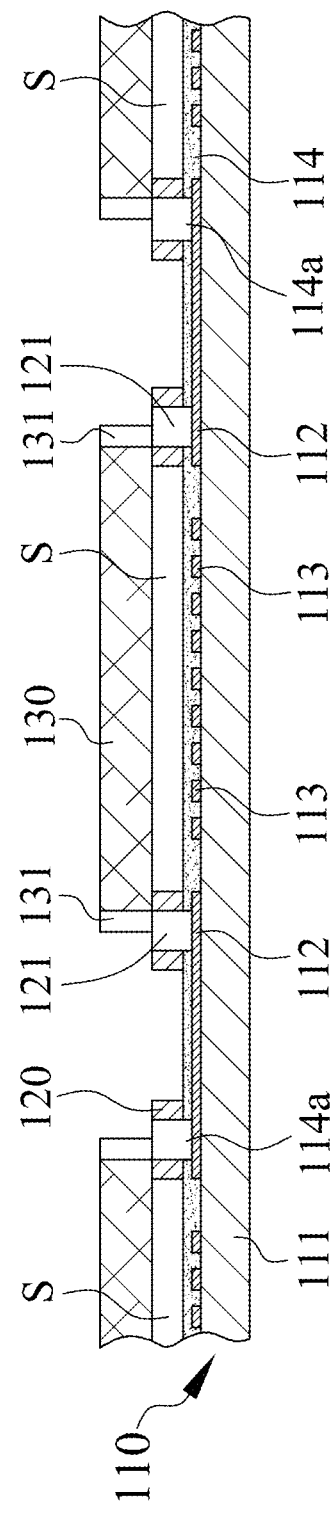
Figure 8:
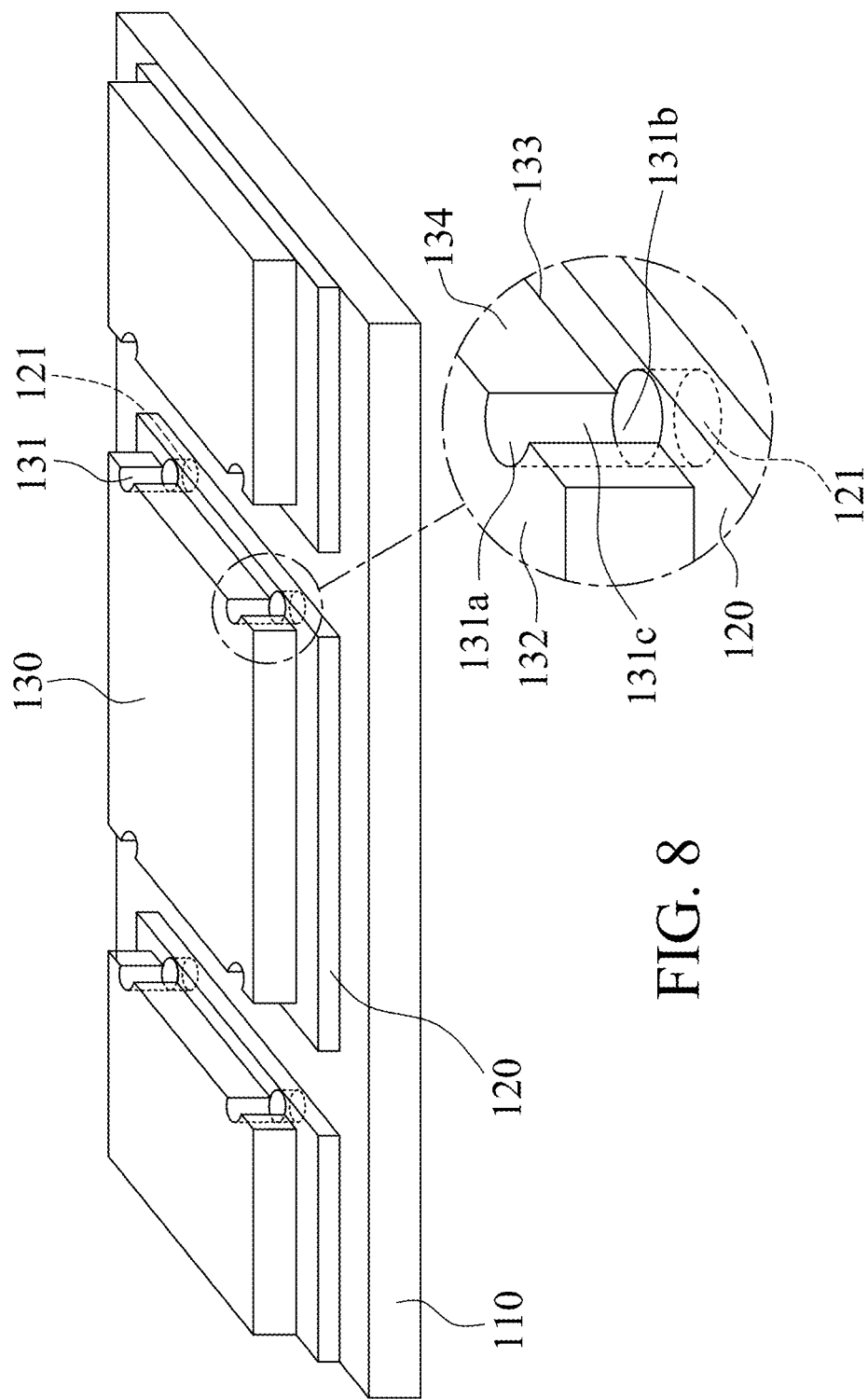
FIG. 8 is a schematic perspective diagram of FIG. 7.

With reference to FIGS. 6, 7 and 8, a cover layer 130, may be made of a polymer material same as the material of the supportive layer 120, is formed on the patterned supportive layer 120 to cover the lower via hole 121 and the opening hole 122 in the step 14, and then the cover layer 130 is patterned to form an upper via hole 131 in the step 15. The upper via hole 131 is located above and communicated to the lower via hole 121 so the upper via hole 131 also exposes the conductive pad 112. The patterned cover layer 130 covers the opening hole 122 of the supportive layer 120, and a space S is defined between the cover layer 130 and the piezoelectric substrate 110. The transducer 113 is located in the space S.

With reference to FIG. 8, different to the lower via hole 121 which is located inside the supportive layer 120, the upper via hole 131 has a first top opening 131a, a first bottom opening 131b and a first lateral opening 131c. The first top opening 131a is located on a top surface 132 of the cover layer 130, the first bottom opening 131b is located on a bottom surface 133 of the cover layer 130, the first lateral opening 131c is located on a lateral surface 134 of the cover layer 130, and both ends of the first lateral opening 131c are connected to the first top opening 131a and the first bottom opening 131b, respectively. In this embodiment, the lower via hole 121 in the supportive layer 120 is a circle hole and the upper via hole 131 exposed on the lateral surface 134 of the cover layer 130 is a semi-circle hole. The lower via hole 121 and the upper via hole 131 may be different shaped holes in other embodiments.

Figure 9:
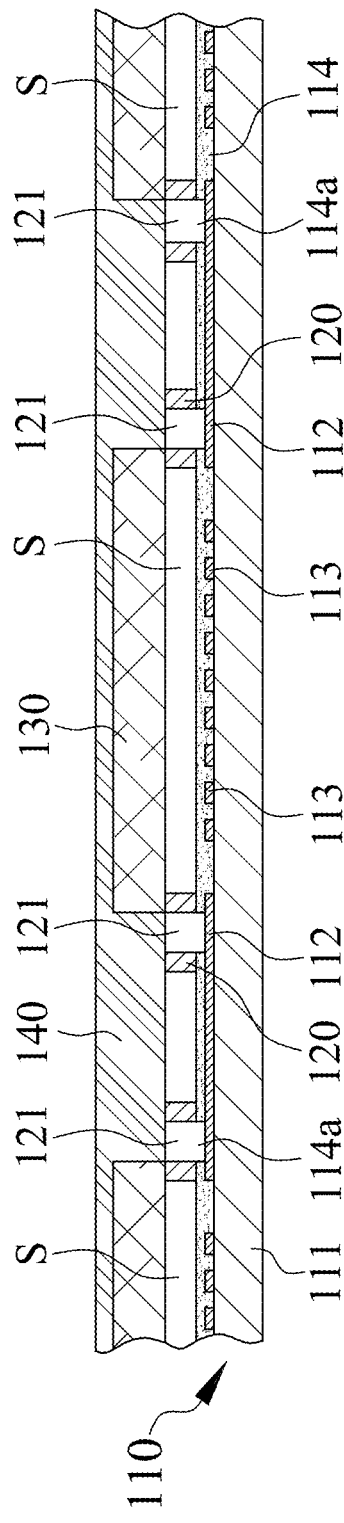
FIGS. 9 to 14 are cross-section view diagrams illustrating a method of manufacturing a SAW device in accordance with one embodiment of the present invention.
Figure 10:
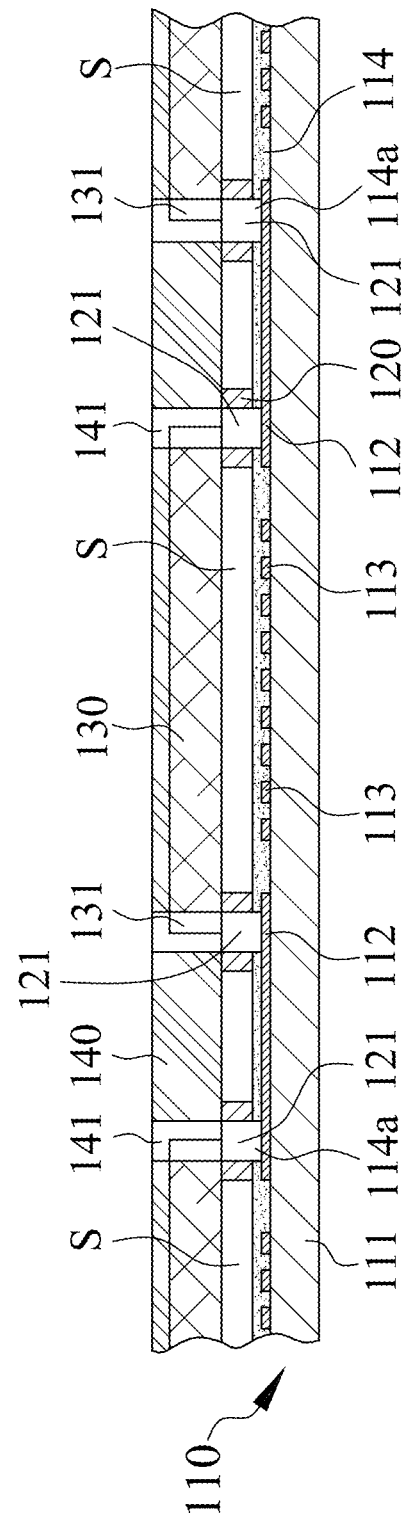

With reference to FIGS. 9 and 10, a photoresist layer 140 is formed on the patterned cover layer 130 in the step 16 and patterned to form an opening 141 in the step 17. The opening 141 communicates to the upper via hole 131 and exposes the conductive pad 112. The opening 141 is preferably a circle opening having a diameter identical to the diameter of the lower via hole 121.

Figure 11:
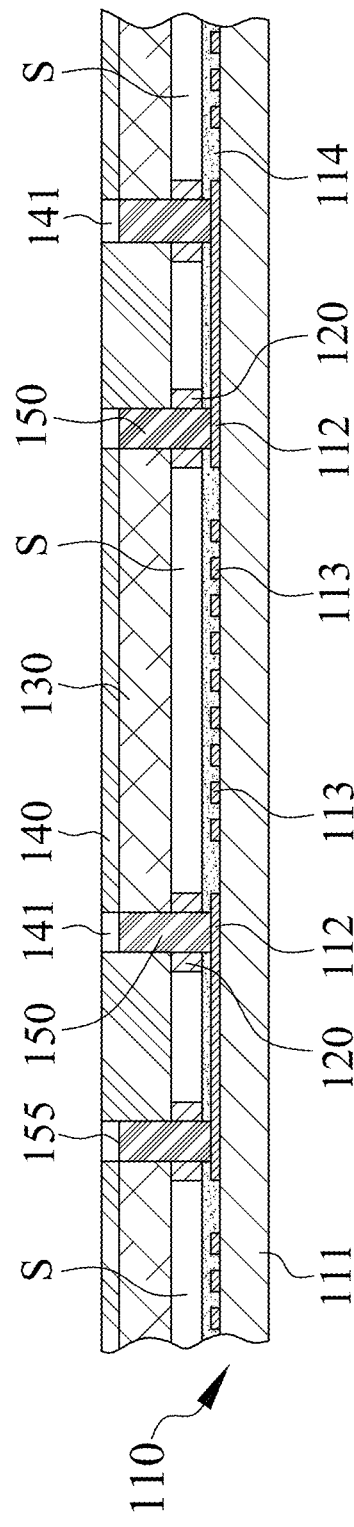
Figure 12:
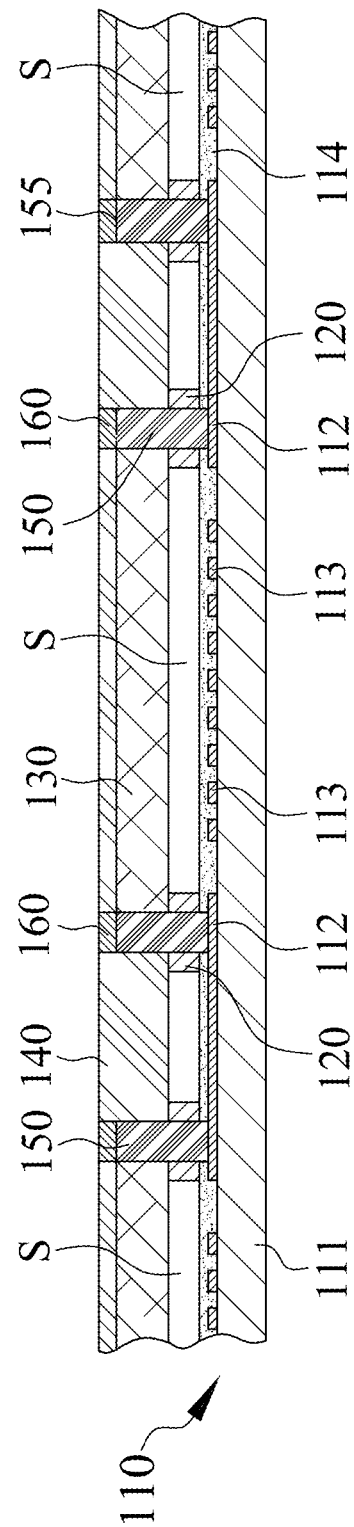
Figure 13:
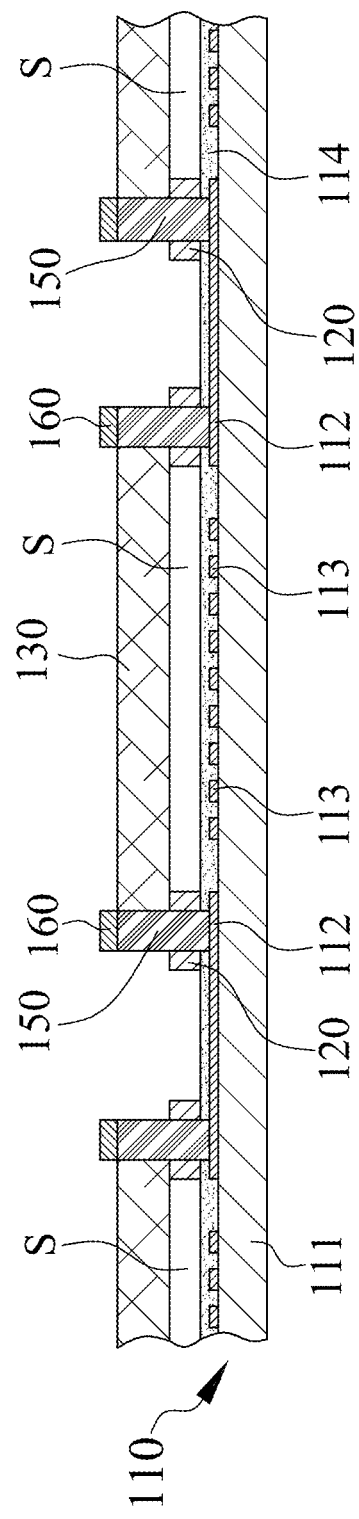
Figure 14:
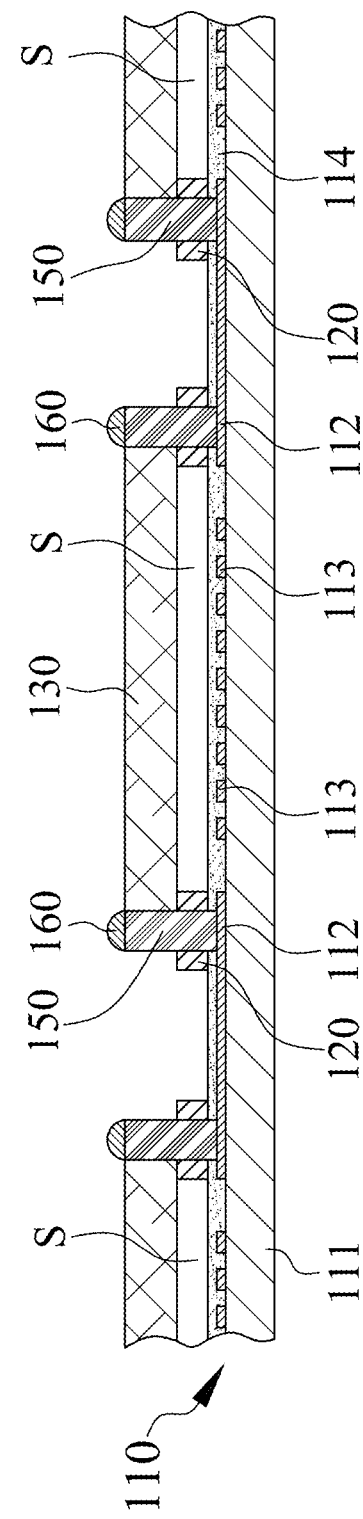

With reference to FIG. 11, a pillar bump 150 connected to the conductive pad 12 is formed in the lower via hole 121 and the upper via hole 131 in the step 18. In this embodiment, the pillar bump 15 is formed through conventional copper plating process.

With reference to FIGS. 12 to 15, a connective element 160 may be formed on a top surface 155 of the pillar bump 150 through conventional tin plating process. The connective element 160 is electrically connected to the conductive pad 112 via the pillar hump 150. After forming the connective element 160, the patterned photoresist layer 140 is removed in the step 19, and then the connective element 160 is reflowed to obtain a SAW device 100.

Figure 15:
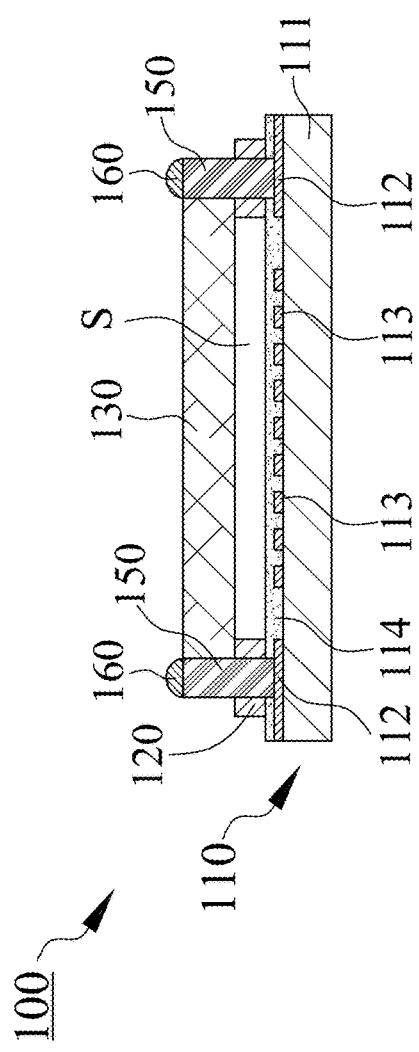
FIG. 15 is a cross-section view diagram illustrating a SAW device in accordance with one embodiment of the present invention.
Figure 16:
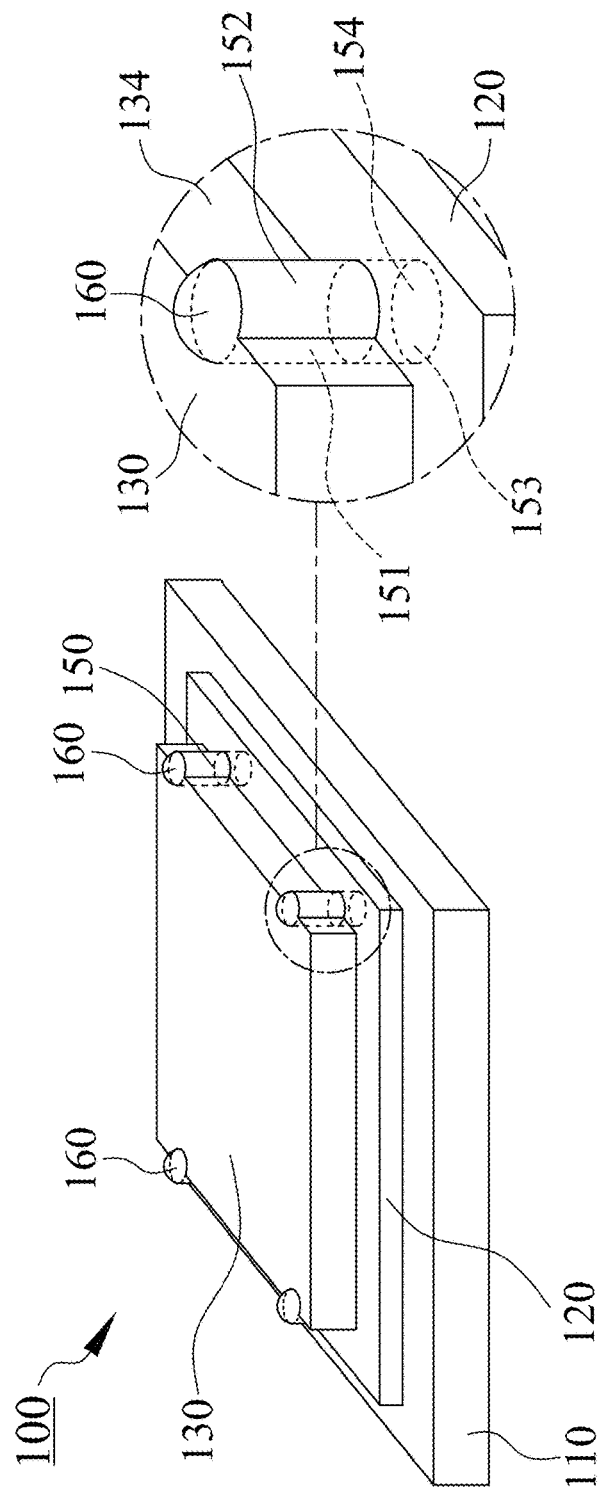
FIG. 16 is a schematic perspective diagram of FIG. 15.
Figure 17:
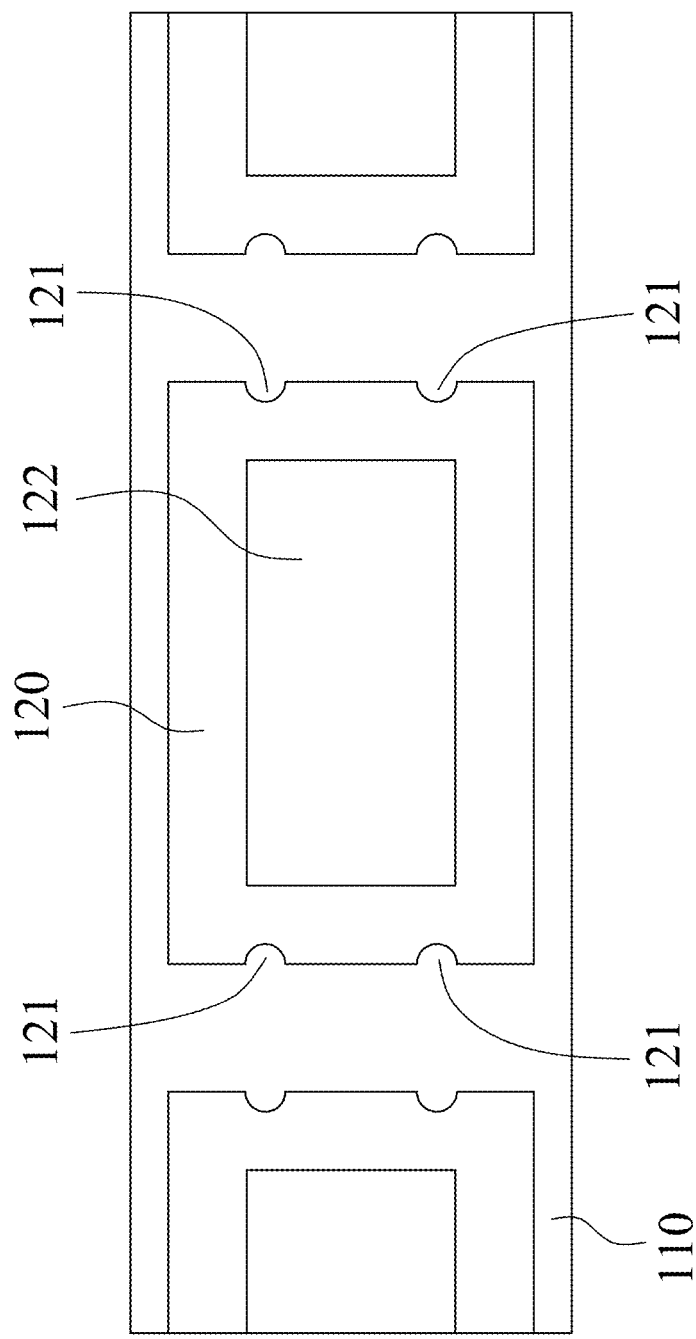
FIG. 17 is a schematic top view diagram illustrating a method of manufacturing a SAW device in accordance with another embodiment of the present invention.
Figure 18:
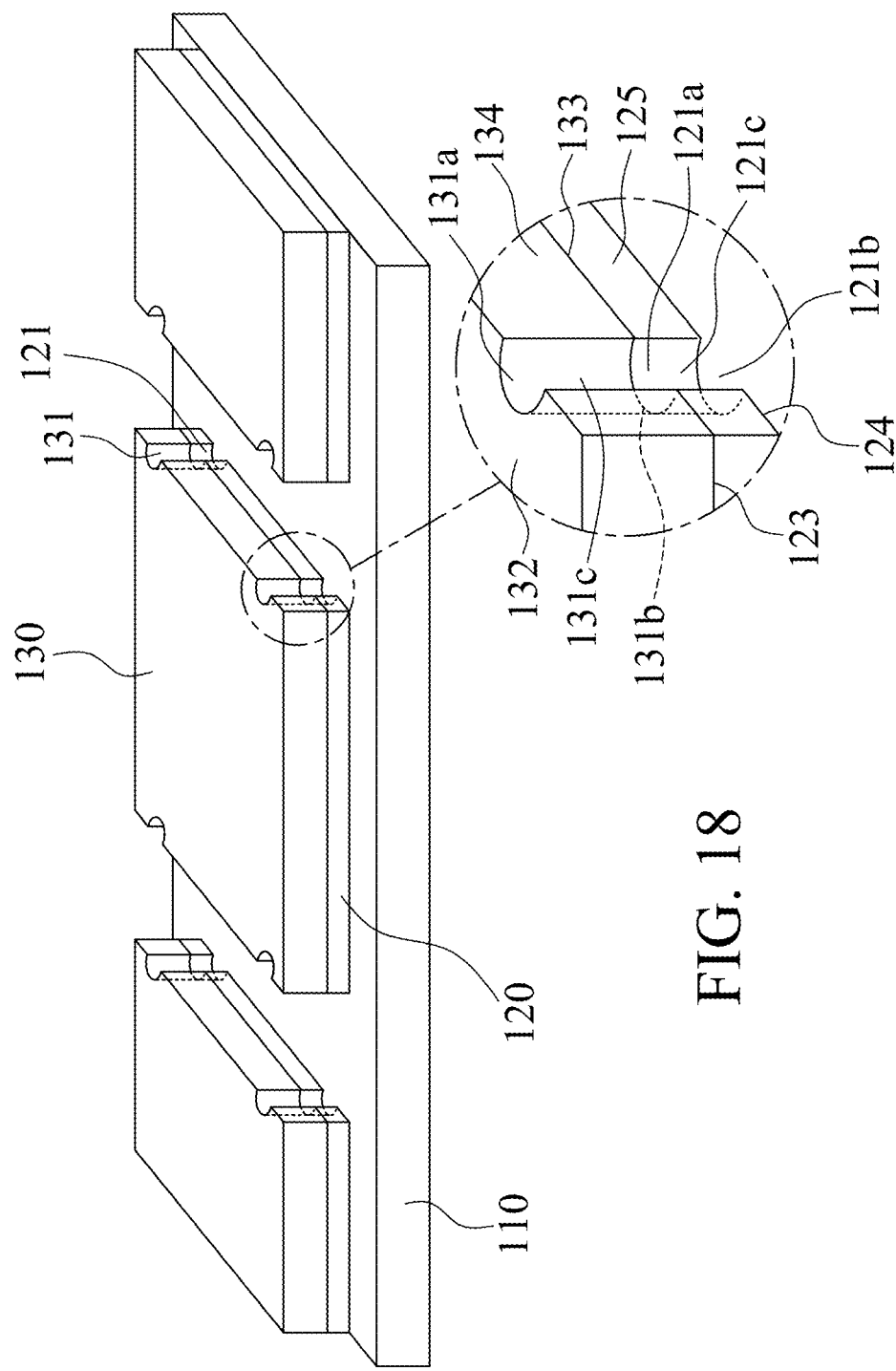
FIG. 18 is a schematic perspective diagram illustrating a method of manufacturing a SAW in accordance with another embodiment of the present invention.
Figure 19:
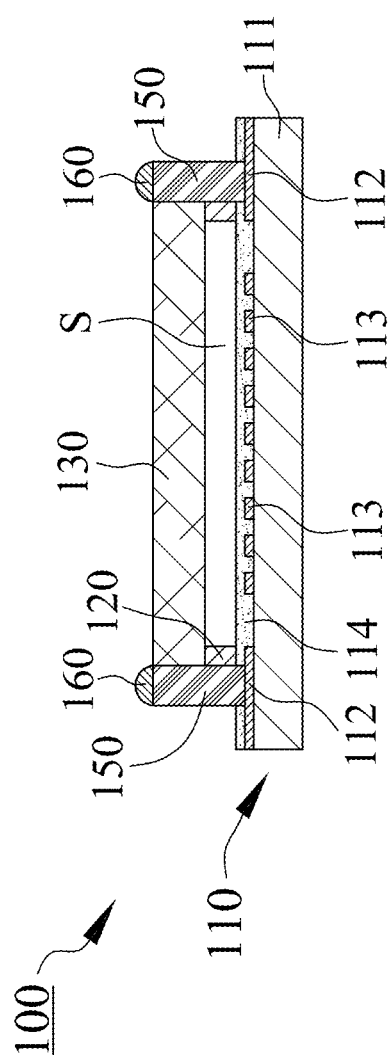
FIG. 19 is a cross-section view diagram illustrating a SAW device in accordance with another embodiment of the present invention.
Figure 20:
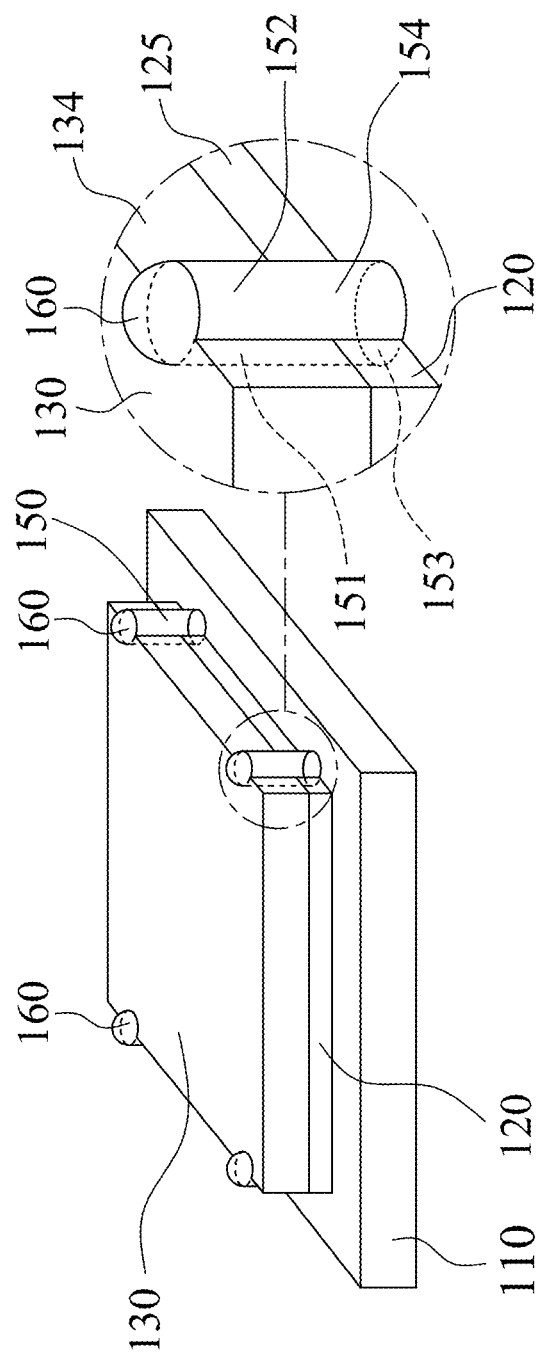
FIG. 20 is a schematic perspective diagram illustrating a SAW in accordance with another embodiment of the present invention.
Figure 21:
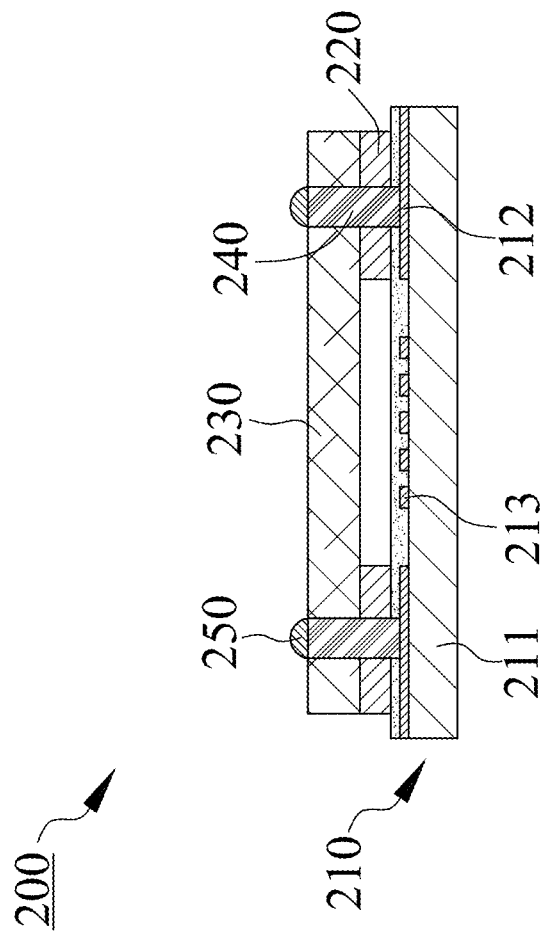
FIG. 21 is a cross-section view diagram illustrating a conventional SAW device.

With reference to FIGS. 15 and 16, the SAW device 100 manufactured by the method 10 of the present invention includes a piezoelectric substrate 110, a supportive layer 120 disposed on the piezoelectric substrate 110, a cover layer 130 disposed on the supportive layer 120 and a pillar bump 150 disposed in a lower via hole 121 of the supportive layer 120 and an upper via hole 131 of the cover layer 130. Preferably, the SAW device 100 further includes a connective element 160 that is disposed on the pillar bump 150.

In this embodiment, the pillar bump 150 in the cover layer 130 includes a first part 151 and a second part 152, and the pillar bump 150 in the supportive layer 120 includes a third part 153 connected to the first part 151 and a fourth part 154 connected to the second part 152. The first part 151 is located in the upper via hole 131, the second part 152 is protruded from the lateral surface 134 of the cover layer 130 via the first lateral opening 131c of the upper via hole 131, the third part 153 and the fourth part 154 are located in the lower via hole 121 of the supportive layer 120. Consequently, the pillar bump 150 is protruded from the cover layer 130 and located inside the supportive layer 120.

Different to conventional SAW device, the package area of the SAW device 100 of the present invention is similar to the area of the space S where the transducer 113 is located in. Consequently, high frequency parasitic capacitance can be reduced to improve the performance of the SAW device 100. If the SAW device 100 and a conventional SAW device have the same package area, the SAW device 100 has a bigger space able to accommodate more transducers 113 so has higher performance than the conventional SAW device. Further, the pillar bump 150 protruded from the cover layer 130 is helpful in dissipating heat generated by the transducer 113 such that the stability of the SAW device 100 can be improved.

FIGS. 17 to 20 illustrate another embodiment of the present invention. In this embodiment, as same as the upper via hole 131, the lower via hole 121 is a semi-circle hole exposed on the lateral surface of the supportive layer 120. The lower via hole 121 has a second top opening 121a, a second bottom opening 121b and a second lateral opening 121c. The second top opening 121a is located on a top surface 123 of the supportive layer 120, the second bottom opening 121b is located on the bottom surface 124 of the supportive layer 120, the second lateral opening 121c is located on a lateral surface 125 of the supportive layer 120, and both ends of the second lateral opening 121c are connected to the second top opening 121a and the second bottom opening 121b, respectively.

The pillar bump 150 in the cover layer 130 includes a first part 151 and a second part 152, and the pillar bump 150 in the supportive layer 120 includes a third part 153 connected to the first part 151 and a fourth part 154 connected to the second part 152. The first part 151 is located in the upper via hole 131, the second part 152 is protruded from the lateral surface 134 of the cover layer 130 via the first lateral opening 131c of the upper via hole 131, the third part 153 is located in the lower via hole 121, and the fourth part 154 is protruded from the lateral surface 125 of the supportive layer 120 via the second lateral opening 121c of the lower via hole 121. Hence, the pillar bump 150 of this embodiment is protruded from the lateral surfaces of the supportive layer 120 and the cover layer 130 simultaneously.

In this embodiment, because of the pillar bump 150 exposed both on the lateral surface 134 of the cover layer 130 and the lateral surface 125 of the supportive layer 120, heat caused by the transducer 113 can be excluded more easily and the package area of the SAW device 100 is more similar to the area of the space S where the transducer 113 is located in. Consequently, the SAW device 100 of this embodiment is more stable and has higher performance.

While this invention has been particularly illustrated and described in detail with respect to the preferred embodiments thereof; it will be clearly understood by those skilled in the art that is not limited to the specific features shown and described and various modified and changed in form and details may be made without departing from the scope of the claims.

What is claimed is:

1. A surface acoustic wave device comprising:
   a piezoelectric substrate including a base, a conductive pad and a transducer, the conductive pad and the transducer are disposed on the base and electrically connected with each other;
   a supportive layer disposed on the piezoelectric substrate and surrounding the transducer, a lower via hole and an opening hole are formed in the supportive layer, the lower via hole is located outside the opening hole and exposes the conductive pad, and the opening hole is located above the transducer;
   a cover layer disposed on the supportive layer and covering the opening hole, an upper via hole is formed in the cover layer, located above the lower via hole and communicated to the lower via hole, wherein the upper via hole has a first top opening, a first bottom opening and a first lateral opening, the first top opening is located on a top surface of the cover layer, the first bottom opening is located on a bottom surface of the cover layer, the first lateral opening is located on a lateral surface of the cover layer, and both ends of the first lateral opening are connected to the first up opening and the first bottom opening, respectively; and
   a pillar bump disposed in the lower via hole and the upper via hole and connected to the conductive pad, wherein the pillar bump in the cover layer includes a first part and a second part, the first part is located in the upper via hole and the second part is protruded from the lateral surface of the cover layer via the first lateral opening of the upper via hole.

2. The surface acoustic wave device in accordance with claim 1, wherein the pillar bump in the supportive layer includes a third part connected to the first part and a fourth part connected to the second part, the third part and the fourth part are located in the lower via hole.

3. The surface acoustic wave device in accordance with claim 1, wherein the lower via hole has a second top opening, s second bottom opening and a second lateral opening, the second top opening is located on a top surface of the supportive layer, the second bottom opening is located on a bottom surface of the supportive layer, the second lateral opening is located on a lateral surface of the supportive layer, and both ends of the second lateral opening are connected to the second top opening and the second bottom opening, respectively.

4. The surface acoustic wave device in accordance with claim 3, wherein the pillar bump in the supportive layer includes a third part and a fourth part, the third part is connected to the first part and located in the lower via hole, the fourth part is connected to the second part and protruded from the lateral surface of the supportive layer via the second lateral opening of the lower via hole.

5. The surface acoustic wave device in accordance with claim 1 further comprising a connective element disposed on a top surface of the pillar bump, wherein the connective element is electrically connected to the conductive pad via the pillar bump.

6. The surface acoustic wave device in accordance with claim 1, wherein the piezoelectric substrate further includes a protective layer which covers the transducer and has an opening exposing the conductive pad.

7. The surface acoustic wave device in accordance with claim 1, wherein the supportive layer has a height higher than a height of the transducer.

* * * * *